(12) United States Patent
Ueda

(10) Patent No.: US 12,095,136 B2
(45) Date of Patent: Sep. 17, 2024

(54) ANTENNA APPARATUS

(71) Applicant: Mitsubishi Electric Corporation, Tokyo (JP)

(72) Inventor: Taro Ueda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 379 days.

(21) Appl. No.: 17/609,420

(22) PCT Filed: Apr. 9, 2020

(86) PCT No.: PCT/JP2020/015956
§ 371 (c)(1),
(2) Date: Nov. 8, 2021

(87) PCT Pub. No.: WO2020/261706
PCT Pub. Date: Dec. 30, 2020

(65) Prior Publication Data
US 2022/0223992 A1    Jul. 14, 2022

(30) Foreign Application Priority Data
Jun. 28, 2019   (JP) .................. 2019-121090

(51) Int. Cl.
*H01Q 1/02* (2006.01)
*H01Q 1/42* (2006.01)
*H01Q 1/28* (2006.01)

(52) U.S. Cl.
CPC ............ *H01Q 1/02* (2013.01); *H01Q 1/42* (2013.01); *H01Q 1/28* (2013.01)

(58) Field of Classification Search
CPC .. H01Q 1/02; H01Q 1/42; H01Q 1/28; H05K 7/20445
See application file for complete search history.

(56) References Cited

U.S. PATENT DOCUMENTS 5,392,053 A * 2/1995 Hirata ............... H01Q 1/42
343/705
8,422,232 B2 * 4/2013 Kwak ............... H01Q 1/42
361/709

(Continued)

FOREIGN PATENT DOCUMENTS

JP    2003298270 A  * 10/2003
JP    2012-109670 A    6/2012

(Continued)

OTHER PUBLICATIONS

International Search Report and Written Opinion mailed on Jun. 30, 2020, received for PCT Application PCT/JP2020/015956, Filed on Apr. 9, 2020, 10 pages including English Translation.

(Continued)

*Primary Examiner* — Seokjin Kim
(74) *Attorney, Agent, or Firm* — XSENSUS LLP

(57) ABSTRACT

An antenna apparatus is provided that allows cooling with a high heat dissipation effect even when the antenna apparatus is reduced in height. The antenna apparatus includes an antenna element, a mount on which the antenna element is provided, a radome to accommodate the antenna element, and a skirt provided on the mount. The mount on which the antenna element is provided has a side surface including a surface to which an inner circumferential surface of the radome is attached. A skirt provided on the mount has an outer circumferential surface on which a heat dissipation fin to dissipate heat to outside is formed. The heat is transmitted from the antenna element through the mount to the skirt.

20 Claims, 9 Drawing Sheets

(56) References Cited

U.S. PATENT DOCUMENTS

| | | | | |
|---|---|---|---|---|
| 2011/0032158 A1* | 2/2011 | Rodger | ................ | H01Q 1/246 |
| | | | | 343/702 |
| 2015/0130671 A1 | 5/2015 | Cordone | | |
| 2015/0130672 A1* | 5/2015 | Cordone | ................ | H01Q 1/28 |
| | | | | 343/705 |
| 2015/0250022 A1* | 9/2015 | Kim | ................ | H05K 7/20545 |
| | | | | 455/561 |
| 2021/0057796 A1* | 2/2021 | Xu | ................ | H01Q 1/246 |
| 2022/0069476 A1* | 3/2022 | Yoo | ................ | H01Q 1/526 |

FOREIGN PATENT DOCUMENTS

| | | |
|---|---|---|
| JP | 2016-539606 A | 12/2016 |
| JP | 2017-152810 A | 8/2017 |

OTHER PUBLICATIONS

Extended European search report issued on Aug. 4, 2022, in corresponding European patent Application No. 20833463.1, 7 pages.

\* cited by examiner

ANTENNA APPARATUS

CROSS-REFERENCE TO RELATED APPLICATIONS

This application is based on PCT filing PCT/JP2020/015956, filed Apr. 9, 2020, which claims the priority to Japanese Patent Application No. 2019-121090, filed on Jun. 28, 2019, the entire contents of each are incorporated herein by reference in its entirety.

TECHNICAL FIELD

The present disclosure relates to an antenna apparatus having a heat dissipation structure.

BACKGROUND ART

In order to reduce air resistance, an antenna apparatus mounted on a mobile object such as an aircraft has a relatively small cross-sectional area as viewed from the heading direction of the aircraft (for example, see PTL 1). In the antenna apparatus in PTL 1, a phased-array method is used as a technique for reducing the height of the antenna apparatus in order to reduce the cross-sectional area as viewed from the heading direction. Further, in some phased array-type antenna apparatuses employ a heat radiation fin provided in a heat pipe as a heat dissipation structure for discharging heat from an antenna apparatus by air cooling (for example, see PTL 2).

CITATION LIST

Patent Literature

PTL 1: Japanese Patent Laying-Open No. 2003-298270
PTL 2: Japanese Patent Laying-Open No. 2016-539606

SUMMARY OF INVENTION

Technical Problem

A phased array-type antenna apparatus requires high heat dissipation performance due to increased heat generation density in its antenna unit. According to the antenna apparatus disclosed in PTL 1, however, since the antenna apparatus is mounted on a mobile object, the antenna unit is covered with a radome and not directly exposed to the outside air. Thus, for cooling the antenna unit, a cooling device such as a fan needs to be provided inside the radome, which causes a problem that it is difficult to reduce the height of the antenna apparatus. Also in the antenna apparatus disclosed in PTL 2, for cooling the antenna unit, a space accommodating a heat pipe needs to be provided inside the radome, which also causes a problem that it is difficult to reduce the height of the antenna apparatus.

The present disclosure has been made to solve the above-described problems, and an object of the present disclosure is to obtain an antenna apparatus that allows cooling with a high heat dissipation effect even when the antenna apparatus is reduced in height.

Solution to Problem

An antenna apparatus according to the present disclosure includes: an antenna element; a mount on which the antenna element is provided; a radome to accommodate the antenna element; and a skirt provided on the mount. The mount has a side surface including a surface attached to an inner circumferential surface of the radome. The skirt has an outer circumferential surface on which a heat dissipation fin to dissipate heat to outside is formed, the heat being transmitted from the antenna element through the mount to the skirt.

Advantageous Effects of Invention

The present disclosure can provide an antenna apparatus that allows cooling with a high heat dissipation effect even when the antenna apparatus is reduced in height.

DESCRIPTION OF EMBODIMENTS

Figure 1:
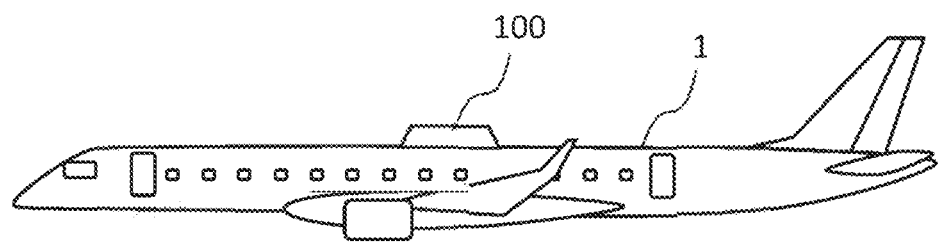
FIG. 1 is a side view of an aircraft equipped with an antenna apparatus according to a first embodiment.

The following describes embodiments in detail with reference to the accompanying drawings, in which the same or equivalent portions are denoted by the same reference characters.

First Embodiment

FIG. 1 is a side view of an aircraft 1 on which an antenna apparatus 100 according to a first embodiment is mounted.

Antenna apparatus 100 is mounted on a mobile object. For example, when antenna apparatus 100 is mounted on aircraft 1 for satellite communication, antenna apparatus 100 is attached to a top surface portion of aircraft 1. Although the figure shows an example of antenna apparatus 100 that is mounted on aircraft 1 in this case, antenna apparatus 100 may be mounted on another type of mobile object. When antenna apparatus 100 is mounted on another type of mobile object, antenna apparatus 100 is attached to a portion of the mobile object such as a top surface portion or a side surface portion, through which radio waves can be transmitted and received.

Figure 2:
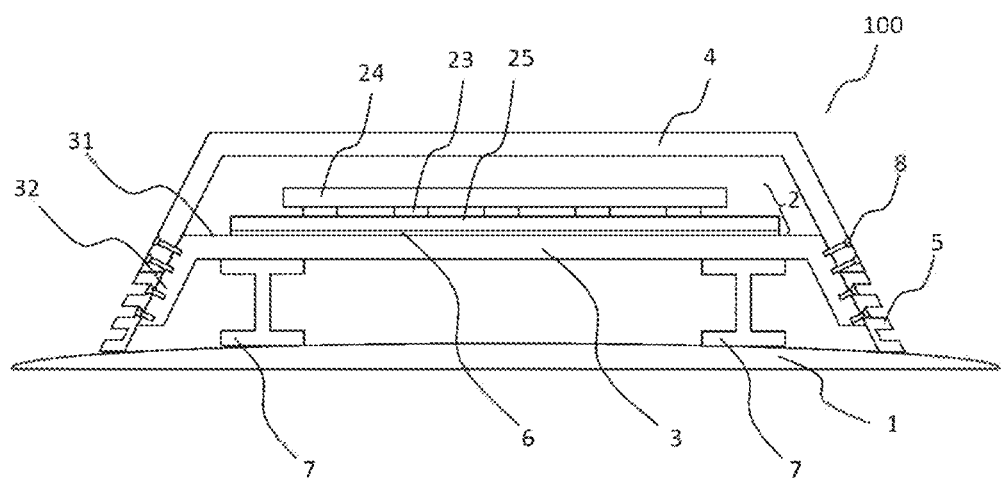
FIG. 2 is a cross-sectional view of the antenna apparatus according to the first embodiment.
Figure 3:
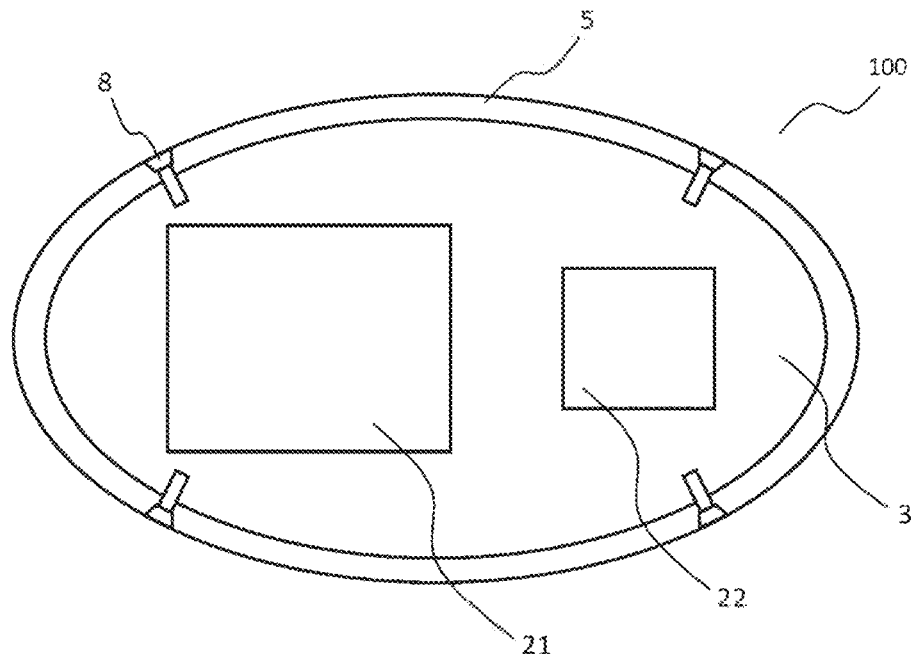
FIG. 3 is a top view of the antenna apparatus according to the first embodiment, from which a radome is removed.

FIG. 2 is a cross-sectional view of antenna apparatus 100 according to the first embodiment. This cross section is perpendicular to a mounting surface of aircraft 1 on which antenna apparatus 100 is mounted. FIG. 3 is a top view of antenna apparatus 100 from which a radome is removed. Antenna apparatus 100 includes an antenna unit 2 including an antenna element, a mount 3 on which antenna unit 2 is provided, a radome 4 to accommodate antenna unit 2, and a skirt 5 provided on mount 3.

Antenna unit 2 includes an antenna element that transmits or receives radio waves. The antenna element is formed of a receiving antenna 21 and a transmitting antenna 22. In the present embodiment, the antenna element is formed of receiving antenna 21 and transmitting antenna 22, but may be formed of one of receiving antenna 21 and transmitting antenna 22. Further, the antenna element may have a configuration in which receiving antenna 21 and transmitting antenna 22 are integrated.

Receiving antenna 21 and transmitting antenna 22 of antenna unit 2 are provided on mount 3. Each of receiving antenna 21 and transmitting antenna 22 includes a radio frequency integrated circuit (RFIC) 23, a radio frequency (RF) substrate 24, and an antenna base 25.

RFIC 23 is provided on a surface of RF substrate 24. RFIC 23 is a module for satellite communication for driving an active electronic scanning array. RF substrate 24 is a substrate on which RFIC 23 is mounted. RF substrate 24 functions to cause RFIC 23 mounted thereon to emit radio waves. Such an active electronic scanning array can direct radio waves in any direction through electronic scanning. Thus, antenna apparatus 100 includes RFIC 23 to thereby eliminate the need to operate antenna unit 2 by mechanical driving when antenna apparatus 100 directs radio waves in any direction in order to track a satellite and communicate with the satellite.

An antenna base 25 is provided between the antenna element and mount 3. More specifically, antenna base 25 is provided between RFIC 23 of receiving antenna 21 and mount 3. Similarly, antenna base 25 is provided between RFIC 23 of transmitting antenna 22 and mount 3. Antenna base 25 is a member through which the heat generated from RFIC 23 and RF substrate 24 of antenna unit 2 is efficiently transmitted to mount 3. Antenna base 25 is made of a metal material having high thermal conductivity, such as aluminum or copper. The heat transmitted from RFIC 23 and RF substrate 24 to antenna base 25 is diffused to the entire antenna base 25. Since antenna base 25 is made of a metal material, mount 3 can be firmly supported even when antenna apparatus 100 receives a load from outside due to vibrations or the like. Thus, antenna base 25 also functions to prevent warping of RFIC 23 and RF substrate 24.

Figure 4:
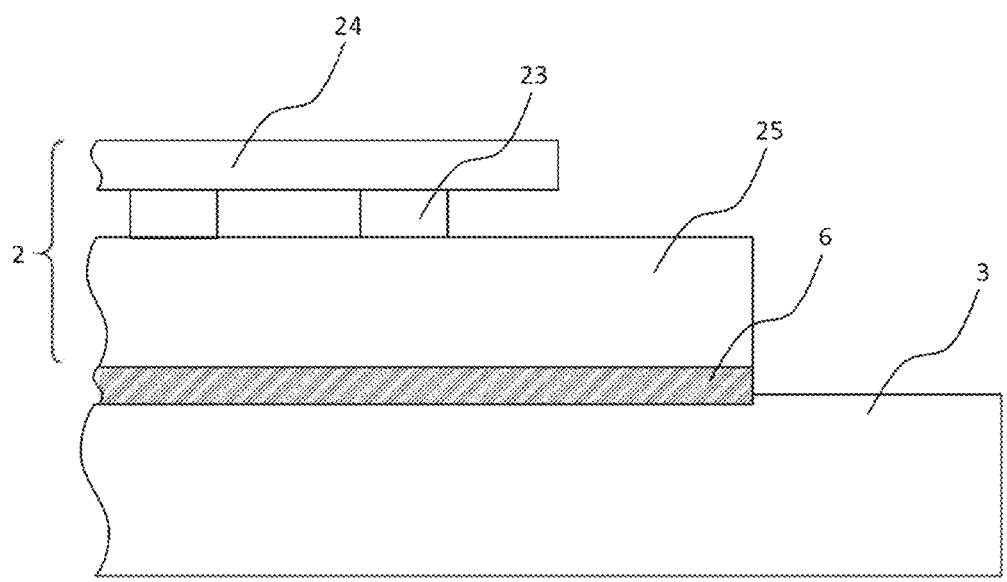
FIG. 4 is an enlarged view of a portion where an antenna unit and a mount in the antenna apparatus according to the first embodiment are joined to each other.

FIG. 4 is an enlarged view of a portion where antenna unit 2 and mount 3 in antenna apparatus 100 according to the first embodiment are joined to each other. It is preferable that antenna base 25 and mount 3 are fastened in close contact with each other. Thus, heat loss can be reduced when the heat generated from RFIC 23 and RF substrate 24 is transmitted to mount 3. It is preferable that the connection surface between antenna base 25 and mount 3 is processed so as to eliminate unevenness on the surface. Thereby, heat loss can be further reduced when the heat generated from RFIC 23 and RF substrate 24 is transmitted to mount 3. Further, it is preferable to provide a thermal interface material (TIM) member 6 between antenna base 25 and mount 3, as shown in FIG. 4. TIM member 6 serves as a member with which a small gap between antenna base 25 and mount 3 is filled. This can reduce the thermal resistance on the connection surface between antenna base 25 and mount 3.

Mount 3 is a member serving as a plate for installing antenna unit 2 in aircraft 1. Mount 3 is attached to aircraft 1 with an attachment bracket 7. Mount 3 is made of a highly rigid metal material in order to prevent transmission of the influence of disturbances caused by a vibration load, a wind load or the like to antenna unit 2. Further, since mount 3 made of a metal material has high thermal conductivity, the heat transmitted from antenna unit 2 can be diffused to the entire mount 3.

Figure 5:
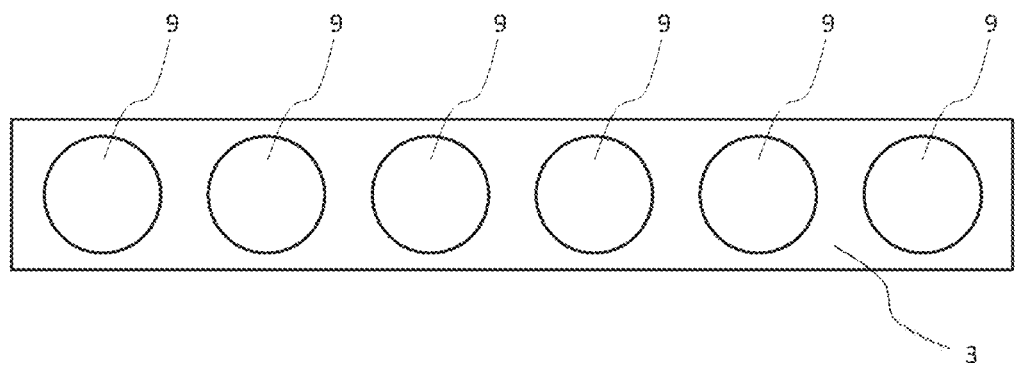
FIG. 5 is a cross-sectional view of the mount of the antenna apparatus according to the first embodiment, in which a heat pipe is provided in the mount.

FIG. 5 is a cross-sectional view of mount 3 of antenna apparatus 100 according to the first embodiment, in which a heat pipe 9 is provided in mount 3. As shown in FIG. 5, mount 3 may have a configuration in which heat pipe 9 extends throughout mount 3. As heat pipe 9 is provided in mount 3, the heat transmitted from RFIC 23 and RF substrate 24 to antenna base 25 can be efficiently diffused to the entire mount 3. Further, since heat pipe 9 provided in mount 3 is made of a metal material, mount 3 can be firmly supported even when antenna apparatus 100 receives an external load due to vibrations or the like. Therefore, warping of RFIC 23 and RF substrate 24 can also be prevented.

As shown in FIG. 2, mount 3 is a component having a first surface 31 and a side surface 32 that is connected to first surface 31. Antenna unit 2 is provided on first surface 31 of mount 3. More specifically, antenna base 25 of antenna unit 2 is provided on first surface 31 of mount 3, and receiving antenna 21 and transmitting antenna 22 are provided on antenna base 25. First surface 31 is an elliptical plate. Side surface 32 is a cylindrical portion having an inclined shape and is connected to the outer circumferential surface of first surface 31 to be inclined at an obtuse angle relative to first surface 31. Side surface 32 of mount 3 has a diameter that decreases from an end portion opposite to an end portion connected to first surface 31 toward the end portion connected to first surface 31. Accordingly, mount 3 has an elliptical shape when viewed from the top surface and has a trapezoidal shape when viewed from the side surface.

Figure 6:
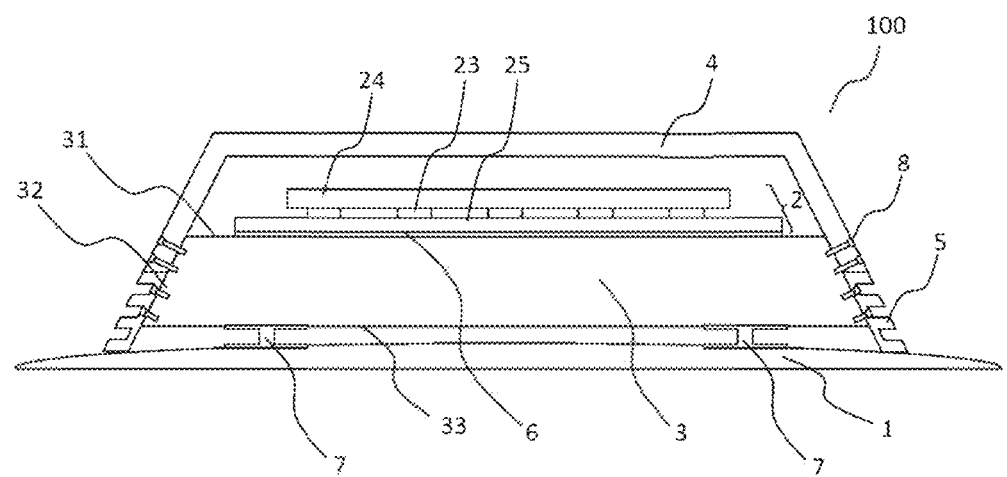
FIG. 6 is a cross-sectional view showing another configuration of the antenna apparatus according to the first embodiment.

Mount 3 may have any shape. In this case, first surface 31 of mount 3 has a suitable elliptical shape but may have any shape such as a polygonal shape or a circular shape. For example, mount 3 may be a truncated conical member. FIG. 6 shows mount 3 having a truncated conical shape. Mount 3 shown in FIG. 6 has the same shape as mount 3 shown in FIG. 2 except that no cavity exists. In this case, mount 3 is configured to have: a first surface 31; a second surface 33 opposite to first surface 31; and a side surface 32 connecting first surface 31 and the second surface.

Radome 4 is a component for protecting antenna unit 2 of antenna apparatus 100 from external environments such as hot air, cold air, rain, and wind from outside radome 4. Radome 4 has a cylindrical shape having one closed end portion and the other open end portion. Further, radome 4 is formed to have an inclined side surface and to have a diameter that decreases from the open end portion toward the closed end portion. Radome 4 has a shape inclined along the shape of side surface 32 of mount 3. As compared with a cylindrical shape without being inclined, mount 3 and radome 4 each having an inclined shape can reduce the external resistance and also can suppress transmission of the influence of disturbances caused by a vibration load and a wind load to antenna unit 2.

Radome 4 is fixed to mount 3 with a fastening component 8. A part of mount 3 is fitted into radome 4. The inner circumferential surface of the open end portion of radome 4 is fixed to side surface 32 of mount 3. Fastening component 8 is attached toward mount 3 from the outer circumferential surface side of radome 4. Fastening component 8 is a member such as a bolt, a rivet or the like for fastening radome 4 and mount 3. Countermeasures are taken against loosening of fastening component 8 that results from loads and vibrations occurring during flight of aircraft 1. Radome 4 and mount 3 fixed in this manner prevents radome 4 from becoming detached from mount 3 even when aircraft 1 receives a load caused by disturbances while it is traveling.

In this case, the first surface of mount 3 is located inside radome 4. An end portion of side surface 32 of mount 3 that is connected to first surface 31 is located inside radome 4. An end portion of side surface 32 of mount 3 that is opposite to the end portion connected to first surface 31 is located outside radome 4. In other words, a part of mount 3 is fitted into radome 4 while a part of mount 3 protrudes from radome 4. Thereby, side surface 32 of mount 3 includes a surface to which the inner circumferential surface of radome 4 is attached and a surface located outside radome 4. Further, when mount 3 shown in FIG. 6 has a truncated conical shape, the end portion of side surface 32 of mount 3 that is connected to first surface 31 is located inside radome 4. Also, the end portion of side surface 32 of mount 3 that is opposite to the end portion connected to first surface 31 is located outside radome 4. Further, first surface 31 is located inside radome 4 while second surface 33 is located outside radome 4.

Figure 7:
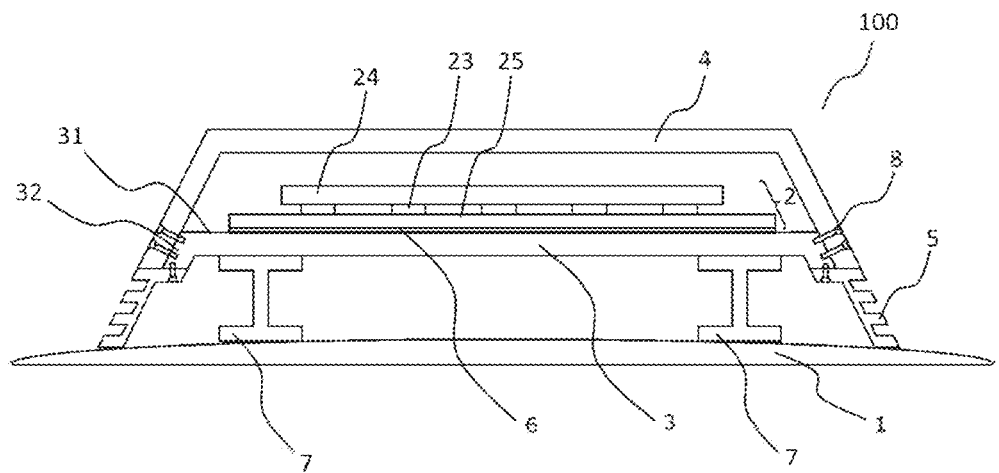
FIG. 7 is a cross-sectional view showing another configuration of the antenna apparatus according to the first embodiment.

In this case, a part of mount 3 is fitted into radome 4 and a part of mount 3 protrudes from radome 4, but mount 3 may have another configuration. FIG. 7 is a cross-sectional view of another configuration of mount 3. For example, mount 3 may be entirely fitted into radome 4 as shown in FIG. 7. In FIG. 7, the first surface of mount 3 is located inside radome 4. Side surface 32 of mount 3 is also located inside radome 4.

Radome 4 is made of a material having a high dielectric constant and a large dielectric loss tangent and formed to have a predetermined thickness such that radio waves emitted from RF substrate 24 can pass through radome 4. Further, radome 4 is made of a highly strong material such that it can protect antenna unit 2 from external environments such as a wind load and collision with foreign substances.

Figure 8:
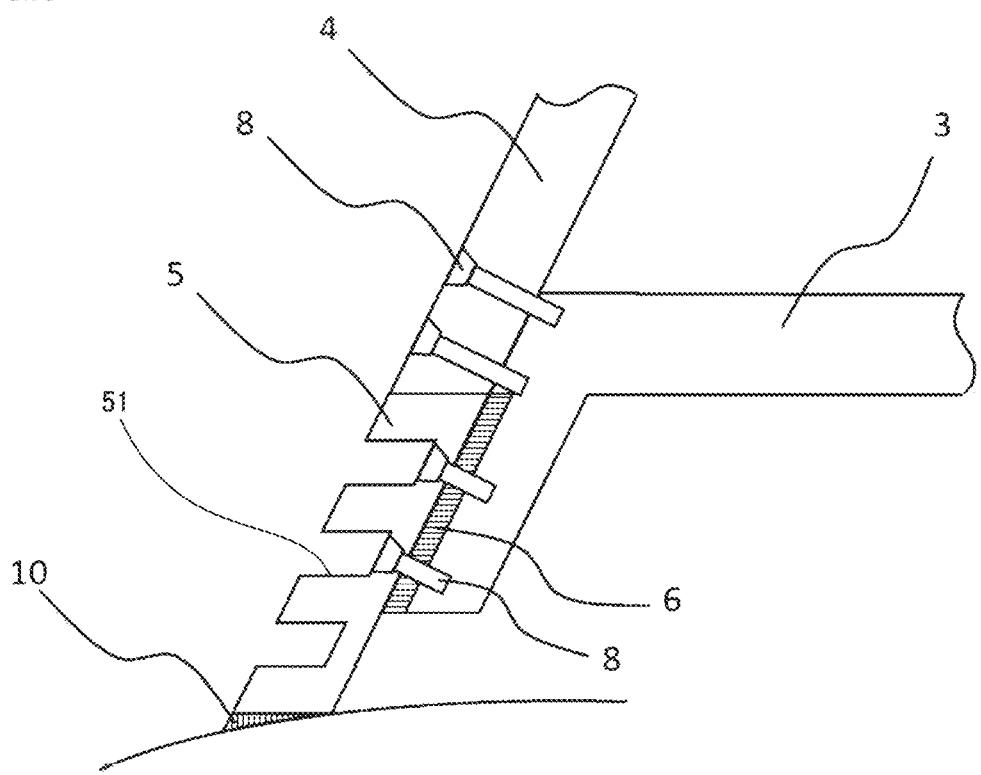
FIG. 8 is an enlarged cross-sectional view of a connection portion between a skirt and the mount in the antenna apparatus according to the first embodiment.

FIG. 8 is an enlarged cross-sectional view of a connection portion between skirt 5 and mount 3 in antenna apparatus 100 according to the first embodiment. Skirt 5 is a component with which the space between aircraft 1 and mount 3 is filled. Skirt 5 has a shape conforming to the shape of a portion of mount 3 to which skirt 5 is attached, and has a cylindrical shape conforming to the shape of side surface 32 of mount 3 in this case. Skirt 5 is provided to cover a surface of side surface 32 of mount 3 that is located outside radome 4. More specifically, the inner circumferential surface of skirt 5 is attached in contact with the surface of side surface 32 of mount 3 that is located outside radome 4. Skirt 5 and mount 3 are fixed with fastening component 8. Fastening component 8 is attached from the outer circumferential surface side of skirt 5 toward mount 3. Fastening component 8 is a bolt, rivet, or the like.

When mount 3 is entirely fitted into radome 4 as shown in FIG. 7, skirt 5 is provided on a surface of mount 3 that is located outside radome 4. Other configurations of skirt 5 are the same as those in FIG. 8. In this case, skirt 5 is provided on a surface of mount 3 that is located outside radome 4. However, skirt 5 may be preferably at least partially connected to mount 3 or may be provided on a surface of mount 3 that is located inside radome 4, for example, between mount 3 and radome 4.

The inner circumferential surface of skirt 5 is fastened to mount 3 with TIM member 6 interposed therebetween. This allows filling of the gap between skirt 5 and mount 3, so that skirt 5 can be brought into close contact with mount 3. The end portion of skirt 5 on the radome 4 side is connected to radome 4 so as to extend along the open end portion of radome 4. The end portion of skirt 5 opposite to radome 4 is connected to aircraft 1 so as to extend along the curved surface of aircraft 1.

Skirt 5 is attached to aircraft 1 with an elastic member 10 interposed therebetween. Elastic member 10 serves as a member with which a small gap between skirt 5 and aircraft 1 is filled. Elastic member 10 allows close contact between skirt 5 and aircraft 1, so that the wind received by antenna apparatus 100 during flight of aircraft 1 can be prevented from entering the inside of antenna apparatus 100 through the gap between skirt 5 and aircraft 1 and thereby producing lift force. Further, elastic member 10 filling the space between aircraft 1 and skirt 5 can also prevent water from entering the inside of antenna apparatus 100 through the gap between skirt 5 and aircraft 1.

Figure 9:
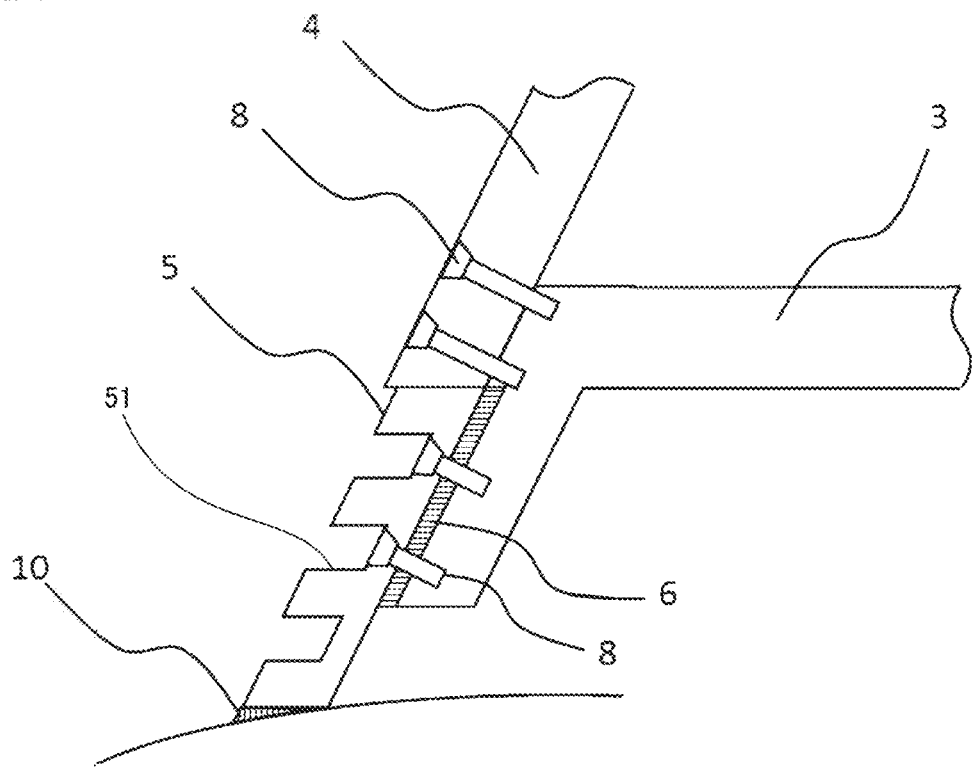
FIG. 9 is an enlarged cross-sectional view of the connection portion between the skirt and the mount in the antenna apparatus according to the first embodiment.

As shown in FIG. 8, the connection portion between skirt 5 and radome 4 is configured to be a stepless continuous surface such that the outer circumferential surface of skirt 5 and the outer circumferential surface of radome 4 are continuous. This configuration can reduce the air resistance of antenna apparatus 100. As shown in FIG. 9, the outer circumferential surface of skirt 5 may be located on an inner side than the outer circumferential surface of radome 4.

Skirt 5 is made of a metal material having high thermal conductivity, like antenna base 25 and mount 3. In order to increase the area that is in contact with cold air outside aircraft 1, a heat dissipation fin 51 shaped to have slits is formed along the entire outer circumferential surface of skirt 5. Heat dissipation fin 51 allows heat to dissipate from antenna unit 2 to the outside of antenna apparatus 100. This structure allows skirt 5 itself to function as a heat sink. Thereby, the heat transmitted from mount 3 to skirt 5 can be released from skirt 5 to the outside of aircraft 1.

Heat dissipation fin 51 formed in skirt 5 is provided with a plurality of slits in the circumferential direction of skirt 5. The slits provided in the circumferential direction of skirt 5 extend in the direction corresponding to the traveling direction of aircraft 1, thereby allowing more effective cooling. As described above, heat dissipation fin 51 formed in skirt 5 is suitably provided with slits in the circumferential direction of skirt 5, but may be provided with slits extending in other directions or having other shapes, as required. The directions in which the slits extend and the shapes of the slits may be different depending on the position where heat dissipation fin 51 is provided. Further, heat dissipation fin 51 is formed along the entire outer circumferential surface of skirt 5 in this case, but may be provided only at a position as required. Heat dissipation fin 51 may be provided only on a part of the outer circumferential surface of skirt 5, for example, as in a configuration in which heat dissipation fins 51 are provided only on both sides in the traveling direction of aircraft 1, on which the heat dissipation efficiency is relatively high.

Figure 10:
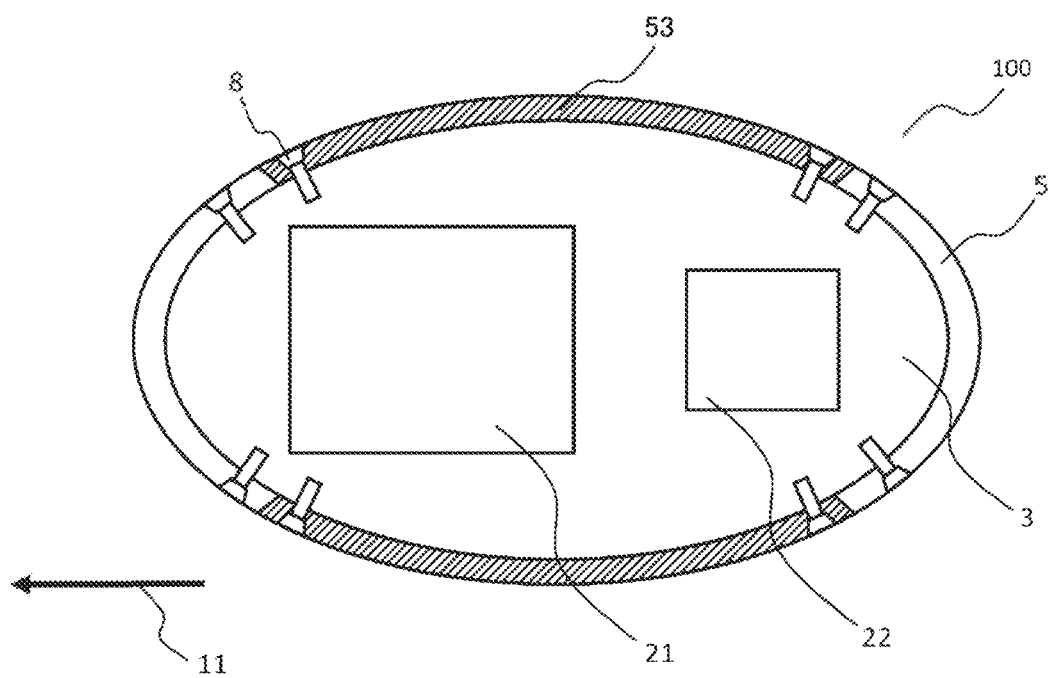
FIG. 10 is a top view showing another configuration of the antenna apparatus according to the first embodiment.

FIG. 10 shows another configuration of antenna apparatus 100 according to the first embodiment. FIG. 10 is a top view of another configuration of antenna apparatus 100 from which radome 4 is removed. An arrow 11 in the figure indicates a traveling direction of aircraft 1. In the figure, a diagonally shaded portion 53 in skirt 5 shows a portion made of a metal material. When the weight of antenna apparatus 100 needs to be taken into consideration, skirt 5 may be configured such that only diagonally shaded portions 53 on both sides with respect to the traveling direction of aircraft 1 as shown in FIG. 10 are made of a metal material having high thermal conductivity and the portions other than diagonally shaded portions 53 are made of a lightweight material such as an elastic material. In this case, heat dissipation fin 51 is formed in diagonally shaded portion 53 of skirt 5. Thereby, heat can be dissipated only from highly efficiently heat-dissipating portions on both sides in the traveling direction of aircraft 1, and other portions can be made of a lightweight material, with the result that antenna apparatus 100 can be reduced in weight.

Figure 11:
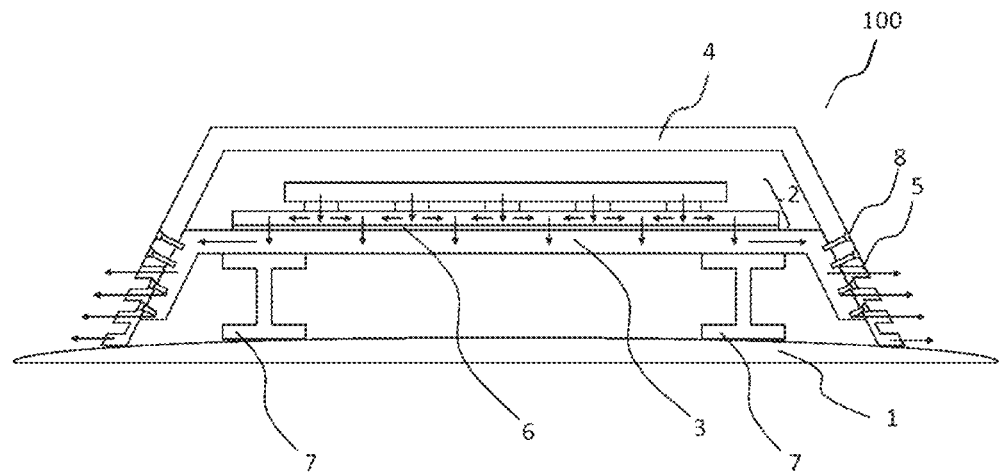
FIG. 11 is a diagram showing a flow of heat dissipation in the antenna apparatus according to the first embodiment.

FIG. 11 is a diagram showing a flow of heat dissipation in antenna apparatus 100. Arrows in the figure indicate the direction in which heat dissipates. The heat generated in transmitting antenna 22 and receiving antenna 21 is transmitted to antenna base 25. The heat transmitted to antenna base 25 is diffused to the entire antenna base 25, and then transmitted to mount 3 through TIM member 6. The heat transmitted to mount 3 is diffused to the entire mount 3 and transmitted to skirt 5 through TIM member 6. The heat transmitted to skirt 5 is finally released to the outside of radome 4 from heat dissipation fin 51 provided on the outer circumference of skirt 5.

In this way, antenna apparatus 100 according to the present embodiment can efficiently transmit the heat generated in receiving antenna 21 and transmitting antenna 22 from mount 3 to skirt 5. Further, skirt 5 itself can be used as a heat sink for heat dissipation. Thereby, the heat generated from the antenna unit can be efficiently dissipated to the outside of radome 4 without having to provide a cooling device such as a fan inside radome 4. In particular, when antenna apparatus 100 is mounted on a mobile object such as aircraft 1, antenna unit 2 is hermetically sealed by radome 4, and therefore, not directly exposed to the outside air. Further, due to equipment constraints, it is difficult to release heat from antenna unit 2 to the body of aircraft 1. Since the heat inside radome 4 can be dissipated from skirt 5 even in such a case, antenna apparatus 100 is not increased in size. Further, the wind flowing around aircraft 1 during flight or the cold air above aircraft 1 can be used for cooling antenna apparatus 100.

Second Embodiment

Figure 12:
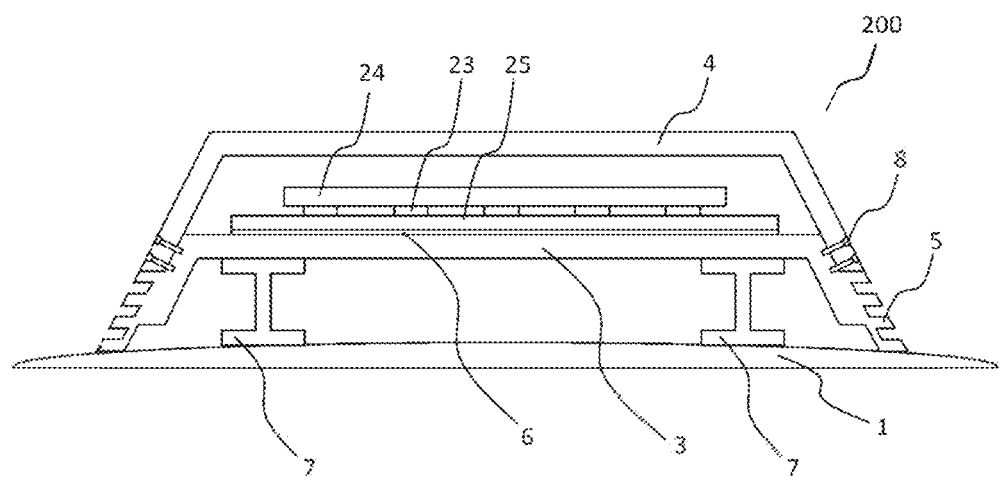
FIG. 12 is a cross-sectional view of an antenna apparatus according to a second embodiment.
Figure 13:
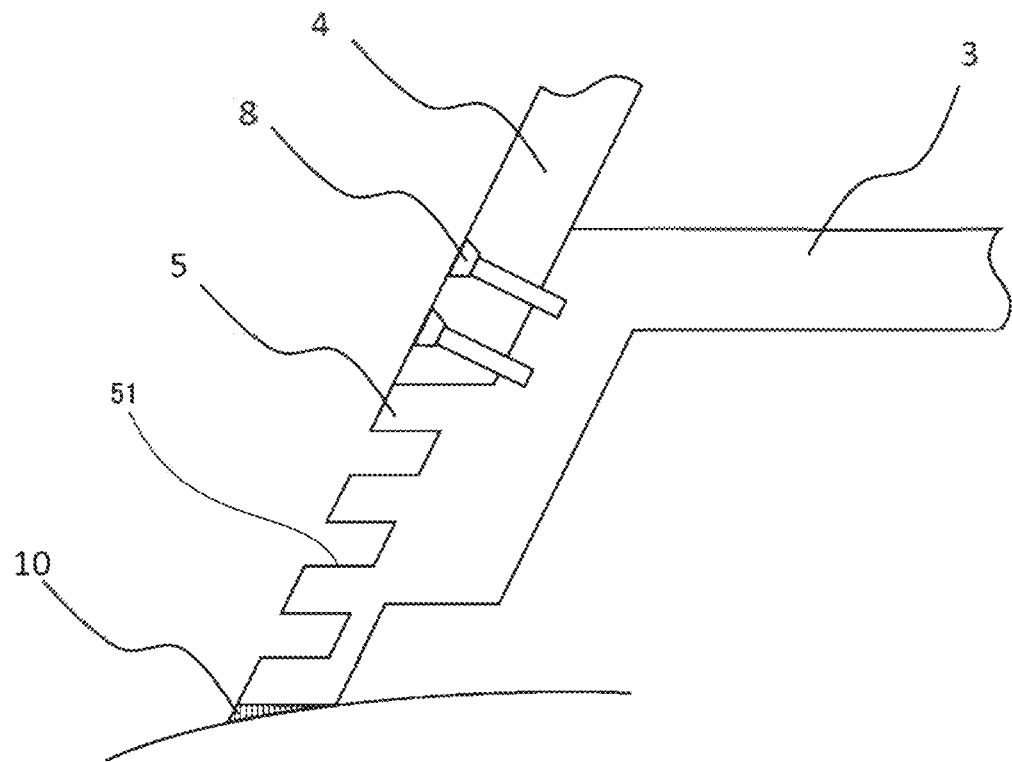
FIG. 13 is an enlarged cross-sectional view of a connection portion between a skirt and a mount in the antenna apparatus according to the second embodiment.

FIG. 12 is a cross-sectional view of an antenna apparatus 200 according to a second embodiment. FIG. 13 is an enlarged cross-sectional view of a connection portion between skirt 5 and mount 3 in antenna apparatus 200 according to the second embodiment. Antenna apparatus 200 is different from antenna apparatus 100 according to the first embodiment in configuration of mount 3 and skirt 5. Other configurations are substantially the same. In the following, the same or corresponding configurations as those described in the above embodiment will be denoted by the same reference characters, and the description thereof will not be repeated.

In antenna apparatus 200 according to the second embodiment, mount 3 and skirt 5 are integrally formed. Mount 3 and skirt 5 are made of the same material. Skirt 5 and mount 3 are made of a metal material having high thermal conductivity. As in antenna apparatus 100, heat dissipation fin 51 shaped to have slits is formed along the entire outer circumferential surface of skirt 5 in order to increase the area of contact with the cold air outside aircraft 1. This structure allows skirt 5 itself to function as a heat sink. Thereby, the heat transmitted from mount 3 to skirt 5 can be released from skirt 5 to the outside of aircraft 1.

Heat dissipation fin 51 formed in skirt 5 is provided with a plurality of slits in the circumferential direction of skirt 5. Since the slits are provided in the circumferential direction of skirt 5, these slits in heat dissipation fin 51 provided on each of both sides with respect to the traveling direction of aircraft 1 extend in the direction corresponding to the traveling direction of aircraft 1, thereby allowing more effective cooling. As described above, heat dissipation fin 51 formed in skirt 5 is suitably provided with slits in the circumferential direction of skirt 5, but may be provided with slits extending in other directions or having other shapes, as required. The directions in which the slits extend and the shapes of the slits may be different depending on the position where heat dissipation fin 51 is provided. In this case, heat dissipation fin 51 is formed along the entire outer circumferential surface of skirt 5, but may be provided only at a position as required. Heat dissipation fin 51 may be provided only on a part of the outer circumferential surface of skirt 5, for example, as in a configuration in which heat dissipation fins 51 are provided only on both sides in the traveling direction of aircraft 1, on which the heat dissipation efficiency is relatively high. Further, mount 3 and skirt 5 may be integrally formed only in a portion of skirt 5 that is provided with heat dissipation fin 51.

Further, as in antenna apparatus 100, when the weight of antenna apparatus 200 needs to be taken into consideration, skirt 5 may be configured such that only portions on both sides with respect to the traveling direction of aircraft 1 are made of a metal material having high thermal conductivity, and other portions are made of a lightweight material such as an elastic material. In this case, heat dissipation fin 51 is formed in a portion of skirt 5 that is made of a metal material. In antenna apparatus 200, mount 3 and skirt 5 are integrally formed only in a portion of skirt 5 that is made of a metal material. Thereby, heat can be dissipated only from highly efficiently heat-dissipating portions on both sides in the traveling direction of aircraft 1, and other portions can be made of a lightweight material, with the result that antenna apparatus 200 can be reduced in weight.

Figure 14:
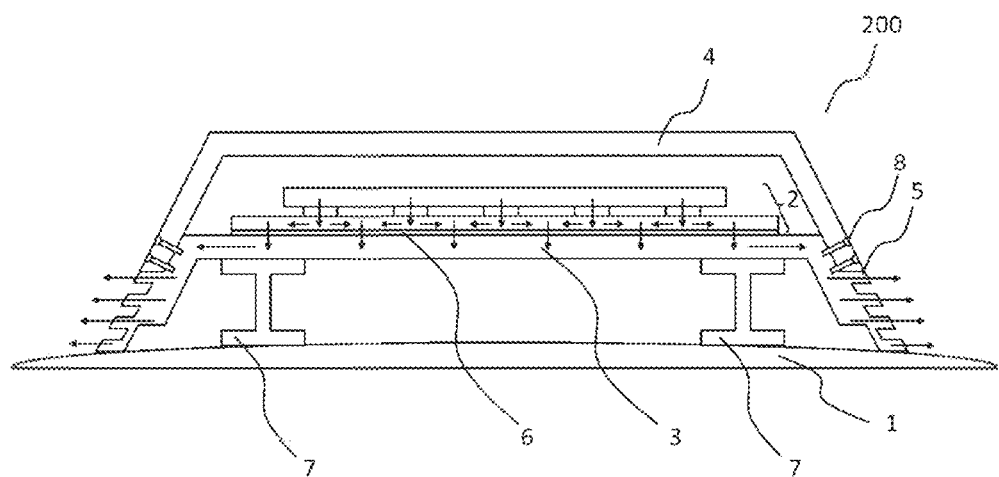
FIG. 14 is a diagram showing a flow of heat dissipation in the antenna apparatus according to the second embodiment.

FIG. 14 is a diagram showing a flow of heat dissipation in antenna apparatus 200. Arrows in the figure indicate the direction in which heat dissipates. The heat generated in transmitting antenna 22 and receiving antenna 21 is transmitted to antenna base 25. The heat transmitted to antenna base 25 is diffused to the entire antenna base 25, and then transmitted to mount 3 through TIM member 6. Then, the heat transmitted to mount 3 is diffused to the entire mount 3 and transmitted to skirt 5 through TIM member 6. The heat transmitted to skirt 5 is finally released to the outside of radome 4 from heat dissipation fin 51 provided on the outer circumference of skirt 5.

Even in antenna apparatus 200 configured as described above, the heat generated from receiving antenna 21 and transmitting antenna 22 can be efficiently transmitted from mount 3 to skirt 5. Further, skirt 5 itself can be used as a heat sink for heat dissipation. Thus, the heat generated from the antenna unit can be efficiently dissipated to the outside of radome 4 without having to provide a cooling device such as a fan inside radome 4. In particular, when antenna apparatus 100 is mounted on a mobile object such as aircraft 1, antenna unit 2 is hermetically sealed by radome 4, and therefore, not directly exposed to the outside air. Further, due to equipment constraints, it is difficult to release heat from antenna unit 2 to the body of aircraft 1. Since the heat inside radome 4 can be dissipated from skirt 5 even in such a case, antenna apparatus 100 is not increased in size. Further, the wind flowing around aircraft 1 during flight or the cold air above aircraft 1 can be used for cooling antenna apparatus 100.

Further, since mount 3 and skirt 5 are integrally formed, the performance for heat dissipation in transmitting heat from mount 3 to skirt 5 can be improved as compared with antenna apparatus 100. Further, mount 3 and skirt 5 do not have to be fixed with fastening component 8, and thereby can be easily assembled. Also, since fastening component 8 and TIM member 6 are not required, the number of components can be reduced.

Third Embodiment

Figure 15:
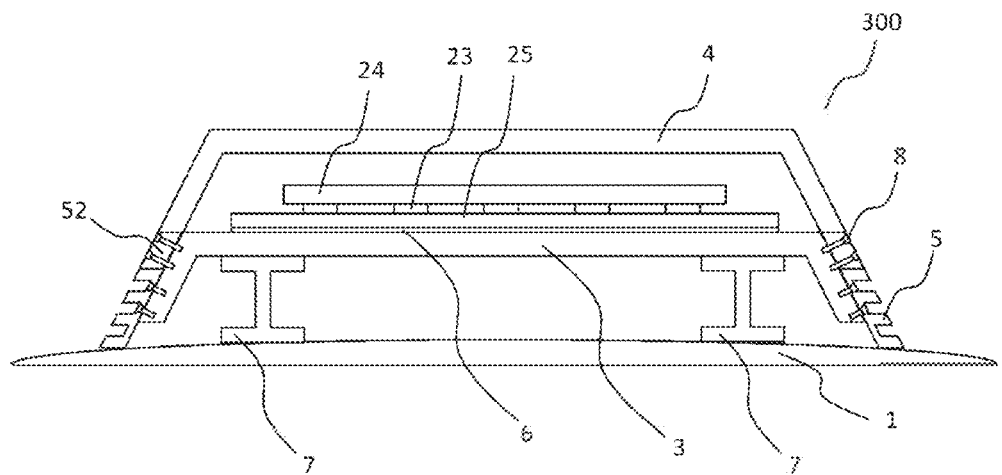
FIG. 15 is a cross-sectional view of an antenna apparatus according to a third embodiment.
Figure 16:
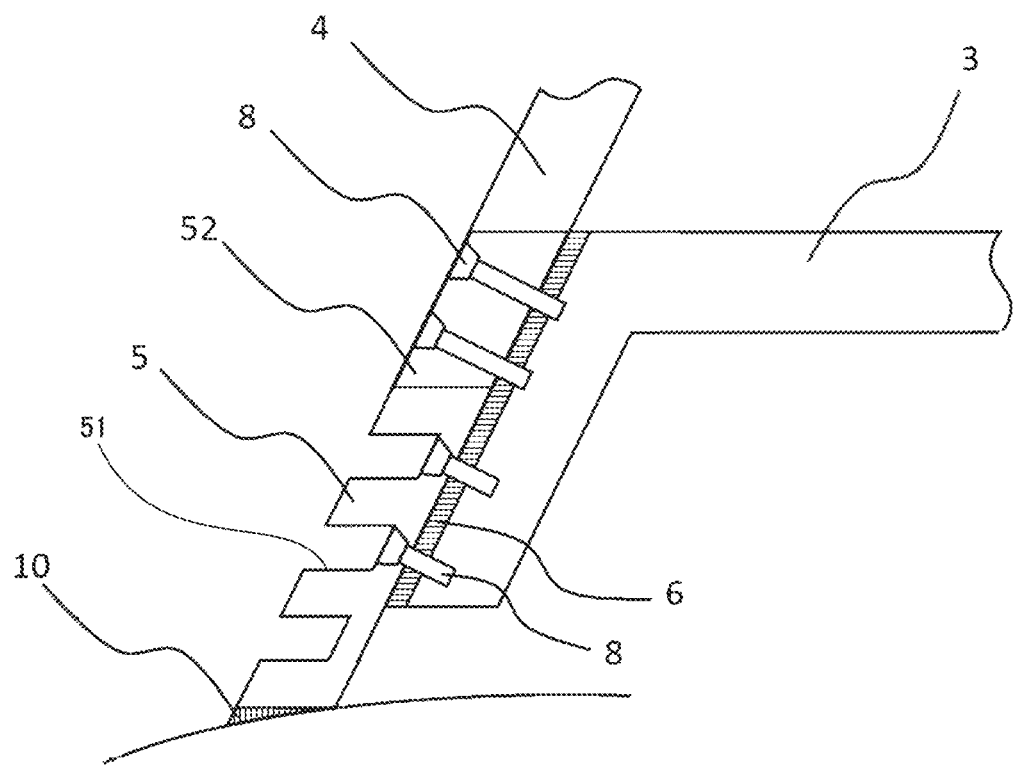
FIG. 16 is an enlarged cross-sectional view of a connection portion between a skirt and a mount in the antenna apparatus according to the third embodiment.

FIG. 15 is a cross-sectional view of an antenna apparatus 300 according to the third embodiment. FIG. 16 is an enlarged cross-sectional view of a connection portion between skirt 5 and mount 3 in antenna apparatus 300 according to the third embodiment. Antenna apparatus 300 is different from antenna apparatus 100 according to the first embodiment in configuration of radome 4 and skirt 5. Other configurations are substantially the same. In the following, the same or corresponding configurations as those described in the above embodiments will be denoted by the same reference characters, and the description thereof will not be repeated.

In antenna apparatus 300 according to the third embodiment, a part of skirt 5 is formed integrally with radome 4. A part of skirt 5 that is formed integrally with radome 4 is a metal block 52 made of a metal material. Metal block 52 is integrally molded with radome 4 at the stage of manufacturing radome 4. As in antenna apparatus 100, heat dissipation fin 51 shaped to have slits is formed along the entire outer circumferential surface of skirt 5 in order to increase the area of contact with the cold air outside aircraft 1. Heat dissipation fin 51 shaped to have slits may be formed also in the portion of metal block 52. This structure allows skirt 5 itself to function as a heat sink. Thereby, the heat transmitted from mount 3 to skirt 5 can be released from skirt 5 to the outside of aircraft 1.

Heat dissipation fin 51 formed in skirt 5 is provided with a plurality of slits in the circumferential direction of skirt 5. Since the slits are provided in the circumferential direction of skirt 5, these slits in heat dissipation fin 51 provided on each of both sides with respect to the traveling direction of aircraft 1 extend in the direction corresponding to the traveling direction of aircraft 1, thereby allowing more effective cooling. As described above, heat dissipation fin 51 formed in skirt 5 is suitably provided with slits in the circumferential direction of skirt 5, but may be provided with slits extending in other directions or having other shapes, as required. The directions in which the slits extend and the shapes of the slits may be different depending on the position where heat dissipation fin 51 is provided. In this case, heat dissipation fin 51 is formed along the entire outer circumferential surface of skirt 5, but may be provided only at a position as required. Heat dissipation fin 51 may be provided only on a part of the outer circumferential surface of skirt 5, for example, as in a configuration in which heat dissipation fins 51 are provided only on both sides in the traveling direction of aircraft 1, on which the heat dissipation efficiency is relatively high.

Further, as in antenna apparatus 100, when the weight of antenna apparatus 300 needs to be taken into consideration, skirt 5 may be configured such that only portions on both sides with respect to the traveling direction of aircraft 1 are made of a metal material having high thermal conductivity, and other portions are made of a lightweight material such as an elastic material. In this case, heat dissipation fin 51 is formed in a portion of skirt 5 that is made of a metal material. Thereby, heat can be dissipated only from highly efficiently heat-dissipating portions on both sides in the traveling direction of aircraft 1, and other portions can be made of a lightweight material, with the result that antenna apparatus 300 can be reduced in weight.

Figure 17:
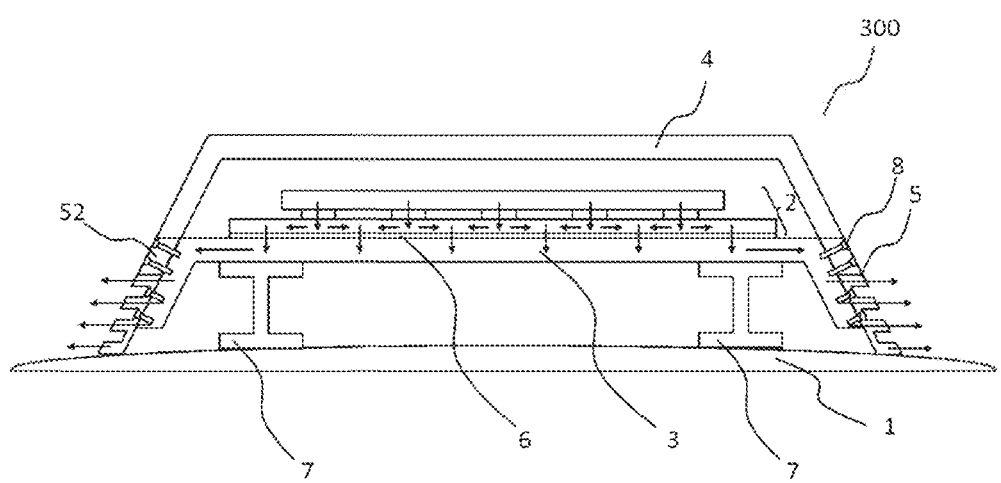
FIG. 17 is a diagram showing a flow of heat dissipation in the antenna apparatus according to the third embodiment.

FIG. 17 is a diagram showing a flow of heat dissipation in antenna apparatus 300. Arrows in the figure indicate the direction in which heat dissipates. The heat generated in transmitting antenna 22 and receiving antenna 21 is transmitted to antenna base 25. The heat transmitted to antenna base 25 is diffused to the entire antenna base 25, and then transmitted to mount 3 through TIM member 6. Then, the heat transmitted to mount 3 is diffused to the entire mount 3 and transmitted to skirt 5 through TIM member 6. The heat transmitted to skirt 5 is finally released to the outside of radome 4 from heat dissipation fin 51 provided on the outer circumference of skirt 5.

Even in antenna apparatus 300 configured as described above, the heat generated from receiving antenna 21 and transmitting antenna 22 can be efficiently transmitted from mount 3 to skirt 5. Further, skirt 5 itself can be used as a heat sink for heat dissipation. Thus, the heat generated from the antenna unit can be efficiently dissipated to the outside of radome 4 without having to provide a cooling device such as a fan inside radome 4. In particular, when antenna apparatus 100 is mounted on a mobile object such as aircraft 1, antenna unit 2 is hermetically sealed by radome 4, and therefore, not directly exposed to the outside air. Further, due to equipment constraints, it is difficult to release heat from antenna unit 2 to the body of aircraft 1. Since the heat inside radome 4 can be dissipated from skirt 5 even in such a case, antenna apparatus 300 is not increased in size. Further, the wind flowing around aircraft 1 during flight or the cold air above aircraft 1 can be used for cooling antenna apparatus 300.

Further, metal block 52 as a part of skirt 5 is produced through integral molding with radome 4 at the stage of manufacturing radome 4, thereby allowing the portion of radome 4 to also have a heat dissipation effect. According to this configuration, the performance for heat dissipation in transmitting heat from mount 3 to skirt 5 can be improved as compared with antenna apparatus 100.

REFERENCE SIGNS LIST 1 aircraft, 2 antenna unit, 21 receiving antenna, 22 transmitting antenna, 23 RFIC, 24 RF substrate, 3 mount, 31 first surface, 32 side surface, 33 second surface, 4 radome, 5 skirt, 51 heat radiation fin, 52 metal block, 6 TIM member, 7 attachment bracket, 8 fastening component, 9 heat pipe, 10 elastic member, 11 traveling direction of aircraft, 100, 200, 300 antenna apparatus.

The invention claimed is:

1. An antenna apparatus comprising:
an antenna element;
a mount on which the antenna element is provided;
a radome to accommodate the antenna element; and
a skirt provided on the mount, wherein
the mount includes a side surface including a surface to which an inner circumferential surface of the radome is attached,
the skirt includes an outer circumferential surface on which a heat dissipation fin is formed as at least one slit in the outer circumferential surface to externally dissipate heat, the heat being transmitted from the antenna element through the mount to the skirt, and
the skirt is connected to a surface of the mount, the surface of the mount being located outside the radome.

2. The antenna apparatus according to claim 1, wherein the side surface of the mount includes
the surface to which the inner circumferential surface of the radome is attached, and
the surface of the mound located outside the radome, and
the skirt covers the surface of the mound located outside the radome in the side surface of the mount.

3. The antenna apparatus according to claim 1, wherein the side surface of the mount is located inside the radome.

4. The antenna apparatus according to claim 1, comprising an antenna base to transmit heat from the antenna element to the mount, the antenna base being provided between the antenna element and the mount.

5. The antenna apparatus according to claim 1, wherein the mount is provided with a heat pipe.

6. The antenna apparatus according to claim 1, wherein the mount and at least a part of the skirt are integrally formed.

7. The antenna apparatus according to claim 1, wherein the radome and at least a part of the skirt are integrally formed.

8. The antenna apparatus according to claim 1, wherein the skirt is attached to a mobile object, and
the heat dissipation fin is provided on each of both sides of the skirt in a traveling direction of the mobile object.

9. The antenna apparatus according to claim 1, wherein the outer circumferential surface of the skirt is located on an inner side than an outer circumferential surface of the radome.

10. The antenna apparatus according to claim 1, wherein the outer circumferential surface of the skirt and an outer circumferential surface of the radome are continuous.

11. The antenna apparatus according to claim 1, wherein the mount includes
a first surface on which the antenna element is provided, and
a second surface that is opposite to the first surface,
the first surface is located inside the radome, and
the second surface is located outside the radome.

12. The antenna apparatus according to claim 1, wherein the heat dissipation fin is formed as a plurality of slits in the outer circumferential surface of the skirt.

13. The antenna apparatus according to claim 1, wherein the skirt is fixed to the surface of the mount by at least one fastening component.

14. The antenna apparatus according to claim 13, wherein the at least one fastening component is provided in the at least one slit.

15. The antenna apparatus according to claim 1, further comprising a thermal interface material disposed between the skirt and the surface of the mount and configured to transfer heat from the mount to the skirt.

16. The antenna apparatus according to claim 1, wherein the radome is made of a dielectric material.

17. The antenna apparatus according to claim 16, wherein the mount is made of metal.

18. The antenna apparatus according to claim 17, wherein the skirt is made of metal.

19. The antenna apparatus according to claim 1, further comprising an elastic member configured to fill a gap between the skirt and an object to which the antenna apparatus is attached.

20. The antenna apparatus according to claim 19, wherein the object is an aircraft.

* * * * *